(12) United States Patent
Kato

(10) Patent No.: US 8,383,953 B2
(45) Date of Patent: Feb. 26, 2013

(54) CIRCUIT BOARD AND METHOD FOR MANUFACTURING THE SAME

(75) Inventor: Noboru Kato, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 13/286,318

(22) Filed: Nov. 1, 2011

(65) Prior Publication Data

US 2012/0043129 A1   Feb. 23, 2012

Related U.S. Application Data

(63) Continuation of application No. PCT/JP2010/055873, filed on Mar. 31, 2010.

(30) Foreign Application Priority Data

May 12, 2009   (JP) .................................. 2009-115213

(51) Int. Cl.
   *H05K 1/11*   (2006.01)
(52) U.S. Cl. ........ 174/261; 174/251; 174/257; 174/262; 361/748; 361/762; 361/767
(58) Field of Classification Search .................. 174/150, 174/251, 255, 260–262; 361/748, 761–763, 361/767, 792
   See application file for complete search history.

(56) References Cited

U.S. PATENT DOCUMENTS

| | | | | |
|---|---|---|---|---|
| 2005/0099783 | A1* | 5/2005 | Alcoe et al. | ................... 361/748 |
| 2005/0189955 | A1* | 9/2005 | Takemoto et al. | ............ 324/754 |
| 2006/0068180 | A1 | 3/2006 | Kondo et al. | |
| 2006/0163740 | A1* | 7/2006 | Ohno et al. | ................... 257/762 |
| 2008/0283279 | A1 | 11/2008 | Ogawa | |
| 2009/0242261 | A1* | 10/2009 | Takenaka et al. | ............. 174/262 |
| 2010/0015093 | A1* | 1/2010 | Einav et al. | .................. 424/85.7 |

FOREIGN PATENT DOCUMENTS

| | | |
|---|---|---|
| JP | 2000-223353 A | 8/2000 |
| JP | 2006-093438 A | 4/2006 |
| JP | 2007-080938 A | 3/2007 |
| JP | 2009-064973 A | 3/2009 |
| WO | 2006/027888 A1 | 3/2006 |

OTHER PUBLICATIONS

Official Communication issued in International Patent Application No. PCT/JP2010/055873, mailed on May 18, 2010.

* cited by examiner

*Primary Examiner* — Hoa C Nguyen

(74) *Attorney, Agent, or Firm* — Keating & Bennett, LLP

(57) ABSTRACT

In a circuit board, a laminate includes a plurality of laminated insulating material layers made of a flexible material. First external electrodes are provided on an upper surface of the laminate, and an electronic component is mounted thereon. Second external electrodes are provided on a lower surface of the laminate and mounted on a wiring board. An internal conductor is provided between first and second adjacent insulating material layers, fixed to the first insulating material layer, and not fixed to the second insulating material layer. The internal conductor is arranged so as to extend across regions obtained by connecting certain ones of the second external electrodes to certain ones of the first external electrodes located closest to the certain ones of the second external electrodes.

9 Claims, 7 Drawing Sheets

CIRCUIT BOARD AND METHOD FOR MANUFACTURING THE SAME

BACKGROUND OF THE INVENTION

1. Field of the Invention

The present invention relates to a circuit board and a method for manufacturing the same, and more specifically, to a circuit board on which an electronic component is mounted, and a method for manufacturing the same.

2. Description of the Related Art

A circuit board including laminated ceramic layers is known. FIG. 11 is a diagram illustrating a configuration in which an existing circuit board 500 is mounted on a printed wiring board 600. An electronic component 700 is mounted on the circuit board 500.

As shown in FIG. 11, the circuit board 500 includes a main body 501 and external electrodes 502 and 503. The main body 501 includes laminated ceramic layers, and is a hard board. The external electrodes 502 and 503 are provided on an upper surface and a lower surface, respectively, of the main body 501.

Further, the printed wiring board 600 is, for example, a mother board mounted in an electronic device, such as a cellular phone, and includes a main body 601 and external electrodes 602 as shown in FIG. 11. The main body 601 is a hard board formed from a resin or the like. The external electrodes 602 are provided on an upper surface of the main body 601.

Further, the electronic component 700 is, for example, a semiconductor integrated circuit, and includes a main body 701 and external electrodes 702. The main body 701 is a semiconductor substrate. The external electrodes 702 are provided on a lower surface of the main body 701.

As shown in FIG. 11, the circuit board 500 is mounted on the printed wiring board 600. Specifically, the circuit board 500 is mounted by the external electrodes 502 being connected to the external electrodes 602 via solder.

As shown in FIG. 11, the electronic component 700 is mounted on the circuit board 500. Specifically, the electronic component 700 is mounted by the external electrodes 503 being connected to the external electrodes 702 via solder. The circuit board 500, the printed wiring board 600, and the electronic component 700 described above are mounted in an electronic device, such as a cellular phone.

The existing circuit board 500 has a problem in that there is the possibility that the circuit board 500 will detach or separate from the printed wiring board 600. Specifically, due to an impact generated when the electronic device in which the circuit board 500 and the printed wiring board 600 are mounted is dropped, the printed wiring board 600 may be bent. Even when the printed wiring board 600 is bent, the circuit board 500 does not greatly deform so as to follow the bending of the printed wiring board 600, because the circuit board 500 is a hard board. Thus, a load is applied to the solder that connects the external electrodes 502 to the external electrodes 602. As a result, the solder may break and the circuit board 500 may detach or separate from the printed wiring board 600.

In order to overcome such a problem, sheets that are made of a flexible material are laminated to produce the circuit board 500. As such a circuit board produced by laminating sheets made of a flexible material, for example, the printed circuit board described in Japanese Unexamined Patent Application Publication No. 2006-93438 is known. It should be noted that for the configuration of the printed circuit board 800, the structure shown in FIG. 11 is used.

As shown in FIG. 11, the printed circuit board 800 described in Japanese Unexamined Patent Application Publication No. 2006-93438 includes a main body 801 and external electrodes (lands) 802 and 803. The main body 801 includes laminated sheets that are made of a thermoplastic resin. The external electrodes 802 and 803 are provided on an upper surface and a lower surface, respectively, of the main body 801. Similarly to the circuit board 500, the printed circuit board 800 is mounted on the printed wiring board 600 via the external electrodes 802 on the lower surface. In addition, similarly to the circuit board 500, the electronic component 700 is mounted on the printed circuit board 800 via the external electrodes 803 on the upper surface.

However, in the printed circuit board 800 described in Japanese Unexamined Patent Application Publication No. 2006-93438, there is the possibility that the electronic component 700 will be detached or separated therefrom. Specifically, since the printed circuit board 800 includes the sheets made of the flexible material, the printed circuit board 800 can be bent. Thus, even when the printed wiring board 600 is bent, the printed circuit board 800 can be bent in accordance with the bending of the printed wiring board 600. Therefore, breakage of the solder that connects the external electrodes 602 to the external electrodes 802 and detachment or separation of the printed circuit board 800 from the printed wiring board 600 are suppressed.

Meanwhile, the printed circuit board 800 has flexibility across the entire surface thereof. Thus, the printed circuit board 800 is bent across the entire surface thereof. On the other hand, the electronic component 700 includes a semiconductor substrate, which cannot significantly bend. Thus, a load is applied to the external electrodes 702 and 803 and the solder that connects the external electrodes 702 and 803. As a result, the solder breaks or the external electrodes 702 and 803 are separated from the main bodies 701 and 801. In other words, the connection between the electronic component 700 and the printed circuit board 800 is broken.

SUMMARY OF THE INVENTION

To overcome the problems described above, preferred embodiments of the present invention provide a circuit board that prevents detachment or separation of an electronic component from the circuit board, and a method for manufacturing the same.

A circuit board according to a preferred embodiment of the present invention preferably includes a laminate including a plurality of laminated insulating material layers made of a flexible material, a plurality of first external electrodes provided on an upper surface of the laminate and connected to an electronic component, a second external electrode provided on a lower surface of the laminate and connected to a wiring board, and a slippage occurrence layer provided between the two adjacent insulating material layers and extending across a region obtained by connecting the second external electrode to the first external electrode located closest to the second external electrode, the slippage occurrence layer not being fixed to at least one of the insulating material layers.

A method for manufacturing the circuit board according to another preferred embodiment of the present invention includes a step of forming the first external electrodes, the second external electrode, and the slippage occurrence layer on the plurality of insulating material layers, and a step of laminating the plurality of insulating material layers such that the slippage occurrence layer extends across a region obtained by connecting the second external electrode to the first external electrode located closest to the second external electrode.

According to various preferred embodiments of the present invention, detachment or separation of an electronic component from a circuit board is.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, a circuit board and a method for manufacturing the same according to preferred embodiments of the present invention will be described with reference to the drawings.

Figure 1:
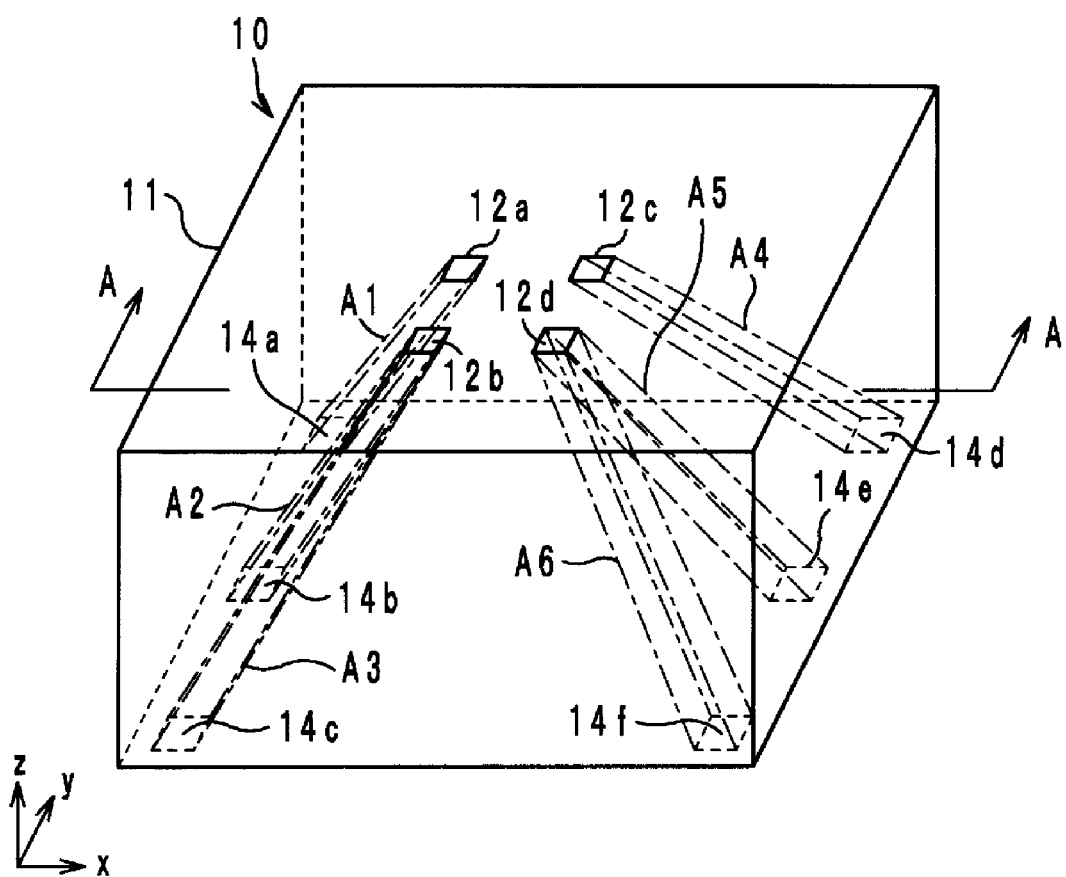
FIG. 1 is an external perspective view of a circuit board according to a preferred embodiment of the present invention.
Figure 2:
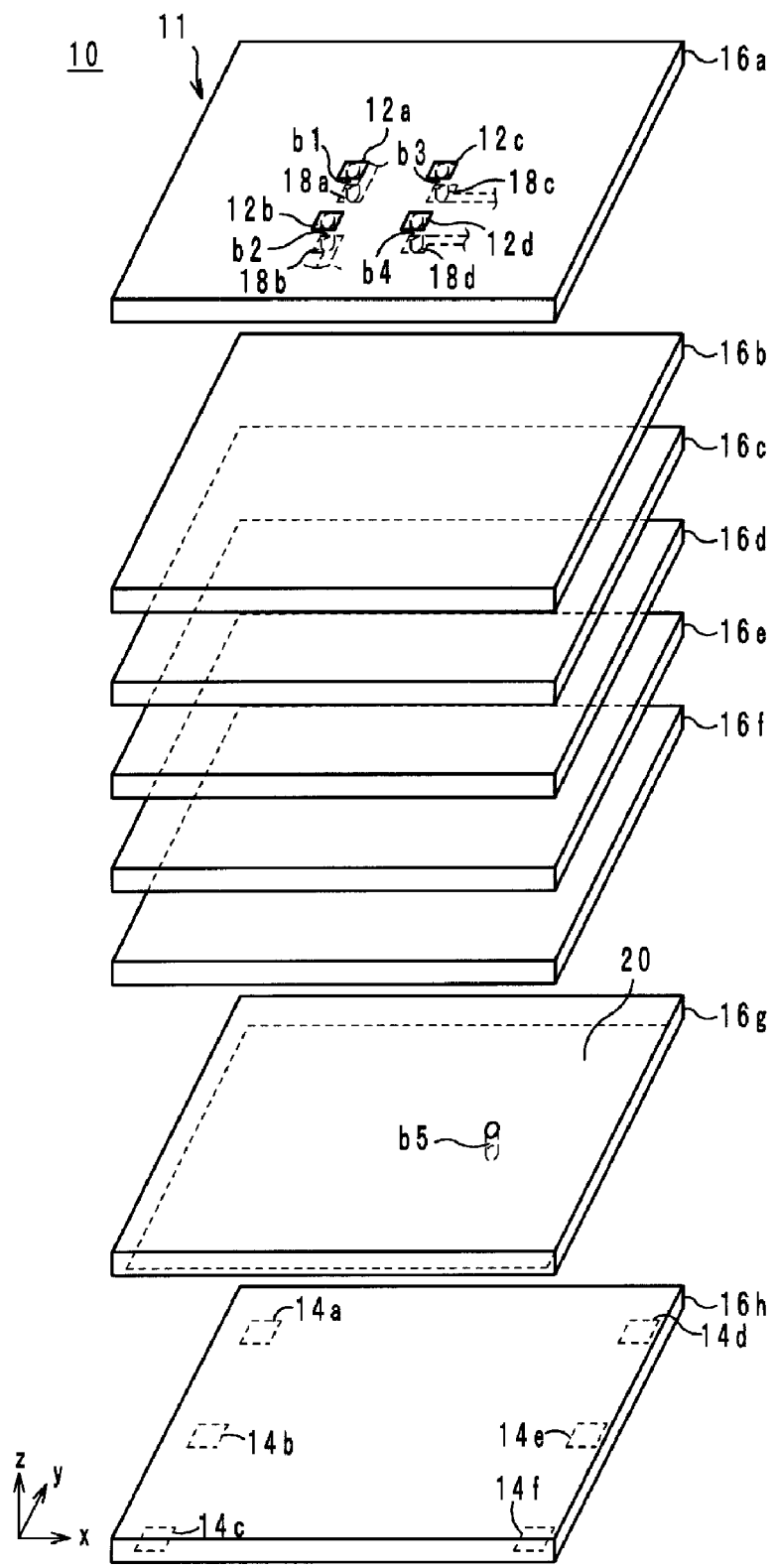
FIG. 2 is an exploded perspective view of the circuit board in FIG. 1.
Figure 3:
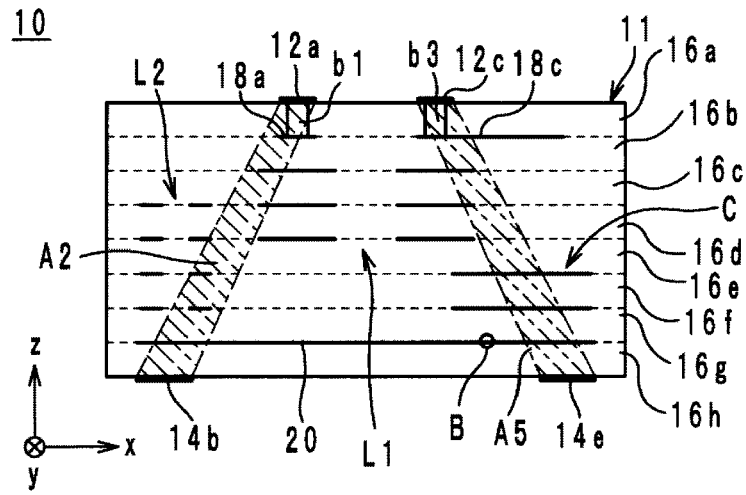
FIG. 3 is a cross-sectional structural view of the circuit board in FIG. 1 along A-A.
Figure 4:
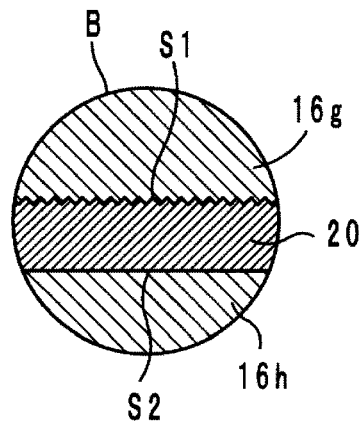
FIG. 4 is an enlarged view at B in FIG. 3.

Hereinafter, the configuration of a circuit board according to a preferred embodiment of the present invention will be described with reference to the drawings. FIG. 1 is an external perspective view of a circuit board 10 according to the present preferred embodiment of the present invention. FIG. 2 is an exploded perspective view of the circuit board 10 in FIG. 1. FIG. 3 is a cross-sectional structural view of the circuit board 10 in FIG. 1 along A-A. FIG. 4 is an enlarged view at B in FIG. 3. In FIGS. 1 to 4, a direction in which insulating material layers are laminated when producing the circuit board 10 is defined as a lamination direction. The lamination direction is defined as a z-axis direction, a direction along long sides of the circuit board 10 is defined as an x-axis direction, and a direction along short sides of the circuit board 10 is defined as a y-axis direction. In addition, in the circuit board 10, a surface on a positive direction side in the z-axis direction is referred to as an upper surface, a surface on a negative direction side in the z-axis direction is referred to as a lower surface, and other surfaces are referred to as side surfaces.

As shown in FIGS. 1 and 2, the circuit board 10 preferably includes a laminate 11, external electrodes 12 (12a to 12d), 14 (14a to 14f), internal conductors 18 (18a to 18d) and 20, and via-hole conductors b1 to b5. As shown in FIG. 2, the laminate 11 preferably includes laminated rectangular or substantially rectangular insulating material layers 16a to 16h made of a flexible material (e.g., a thermoplastic resin, such as a liquid crystal polymer). Thus, the laminate 11 preferably has a rectangular or substantially rectangular parallelepiped shape. Hereinafter, a front surface of the insulating material layer 16 refers to a principal surface on the positive direction side in the z-axis direction, and a back surface of the insulating material layer 16 refers to a principal surface on the negative direction side in the z-axis direction.

The external electrodes 12 are preferably layers made of metal foil of a conductive material (e.g. copper), and are provided on the upper surface of the laminate 11 as shown in FIG. 1. Specifically, the external electrodes 12 are provided on the front surface of the insulating material layer 16a that is provided on the most positive direction side in the z-axis direction. The external electrodes 12a and 12b are arranged so as to be aligned in the y-axis direction. The external electrodes 12c and 12d are provided on the positive direction side in the x-axis direction with respect to the external electrodes 12a and 12b so as to be aligned in the y-axis direction. The external electrodes 12 are arranged to be connected to an electronic component mounted on the upper surface of the laminate 11.

The external electrodes 14 are preferably defined by metal foil made of a conductive material (e.g., copper) and are provided on the lower surface of the laminate 11 as shown in FIG. 1. In other words, the external electrodes 14 are provided on the back surface of the insulating material layer 16h that is provided on the most negative direction side in the z-axis direction. Further, the external electrodes 14a to 14c are preferably arranged along a short side of the lower surface of the laminate 11 that is located on the negative direction in the x-axis direction. Moreover, the external electrodes 14d to 14f are preferably arranged along a short side of the lower surface of the laminate 11 that is located on the positive direction side in the x-axis direction. The external electrodes 14 are preferably arranged to be connected to a mother board, such as a printed wiring board, for example.

The internal conductors 18 are preferably wiring layers defined by metal foil made of a conductive material (e.g., copper) and are included in the laminate 11 as shown in FIG. 2. Specifically, the internal conductors 18 are provided on the back surface of the insulating material layer 16a. Portions of the internal conductors 18a to 18d overlap the external electrodes 12a to 12d, respectively, when seen in a planar view from the z-axis direction. It should be noted that in FIG. 2, only the portions of the internal conductors 18 that overlap the external electrodes 12 and their vicinities are shown, and the other portions are omitted.

The internal conductor 20 is preferably a capacitor conductor defined by metal foil made of a conductive material (e.g., copper) or a film-shaped conductor having a large area, such as a ground conductor, for example, and is included in the laminate 11. The internal conductor 20 is provided on the back surface of the insulating material layer 16g. Thus, the internal conductor 20 is located on the insulating material layer 16h defining the lower surface of the laminate 11.

Further, as shown in FIG. 3, the internal conductor 20 extends across regions A1 to A6 (see FIG. 1) obtained by connecting the external electrodes 14 to the external electrodes 12 located closest to the external electrodes 14. Specifically, the region A1 is a region obtained by connecting the external electrode 14a to the external electrode 12a. The region A2 is a region obtained by connecting the external electrode 14b to the external electrode 12b. The region A3 is a region obtained by connecting the external electrode 14c to the external electrode 12b. The region A4 is a region obtained by connecting the external electrode 14d to the external electrode 12c. The region A5 is a region obtained by connecting the external electrode 14e to the external electrode 12d. The region A6 is a region obtained by connecting the external electrode 14f to the external electrode 12d. Each region obtained by connecting the external electrode 12 to the external electrode 14 preferably is a prism-shaped region that has an upper surface at the external electrode 12 and a lower surface at the external electrode 14.

As shown in FIG. 3, the internal conductor 20 preferably extends across the regions A1 to A6 (only the regions A2 and A5 are shown in FIG. 3). The extension of the internal conductor 20 across the regions A1 to A6 indicates that each of the regions A1 to A6 is divided into a region on the upper side in the z-axis direction and a region on the lower side in the z-axis direction by the internal conductor 20 as shown in FIG. 3.

Further, as shown in FIG. 3, the laminate 11 preferably includes coils (circuit elements) L1 and L2 and a capacitor (circuit element) C. The coils L1 and L2 are preferably defined by internal conductors (omitted in FIG. 2) and via-hole conductors (not shown) provided on the back surfaces of the insulating material layers 16b to 16f, for example. The capacitor C is preferably defined by internal conductors (omitted in FIG. 2) provided on the back surfaces of the insulating material layers 16e and 16f.

Meanwhile, each of the internal conductors 18 and 20 and the internal conductors defining the coils L1 and L2 and the capacitor C is preferably provided between two adjacent insulating material layers 16, fixed to one of the insulating material layers 16, and not fixed to the other insulating material layer 16. Hereinafter, a detailed description will be provided with the internal conductor 20 as an example.

As shown in FIG. 4, the internal conductor 20 includes principal surfaces S1 and S2. The principal surface S1 is a principal surface located on the positive direction side in the z-axis direction with respect to the principal surface S2. The surface roughness Ra of the principal surface S1 is preferably greater than the surface roughness Ra of the principal surface S2. For example, the surface roughness Ra of the principal surface S2 is preferably substantially equal to or less than about 10% of the thickness of the internal conductor 20, and the surface roughness Ra of the principal surface S1 is preferably greater than the surface roughness Ra of the principal surface S2, for example. The internal conductor 20 is in contact at the principal surface S1 with the back surface of the insulating material layer 16g. On the principal surface S1, recesses and projections are preferably provided. Thus, the internal conductor 20 is fixed to the back surface of the insulating material layer 16g by the anchor effect caused by the recesses and the projections on the principal surface S1 digging into the back surface of the insulating material layer 16g. Therefore, between the internal conductor 20 and the back surface of the insulating material layer 16g, no slippage occurs in the x-axis direction and the y-axis direction. It should be noted that in addition to the anchor effect, the internal conductor 20 may be fixed to the back surface of the insulating material layer 16g by an adhesive such as an epoxy adhesive.

Meanwhile, as shown in FIG. 4, the internal conductor 20 is in contact at the principal surface S2 with the front surface of the insulating material layer 16h. On the principal surface S2, there are almost no recesses and projections. In addition, preferably, an adhesive or other bonding material is not applied between the principal surface S2 and the front surface of the insulating material layer 16h. Thus, the internal conductor 20 is not fixed to the front surface of the insulating material layer 16h. Therefore, between the internal conductor 20 and the front surface of the insulating material layer 16h, slippage may occur in the x-axis direction and the y-axis direction. In order to prevent the internal conductor 20 and the insulating material layer 16h from being fixed to each other, the front surface of the internal conductor 20 (the interface with the insulating material layer 16h) is preferably coated with silicon, chromium, zinc, or other suitable material, for example. In addition, the front surface of the internal conductor 20 (the interface with the insulating material layer 16h) may preferably be coated with a carbon resin paste, for example. Further, plasma ion treatment or chemical solution treatment with sodium hydroxide or other suitable material may not be performed only on this surface, thereby preventing the internal conductor 20 and the insulating material layer 16h from being fixed to each other.

The via-hole conductors b1 to b5 are arranged so as to connect the external electrodes 12 and 14, the internal conductors 18 and 20, the coils L1 and L2, and the capacitor C and so as to extend through the insulating material layers 16 in the z-axis direction. Specifically, as shown in FIG. 2, the via-hole conductors b1 to b4 extend through the insulating material layer 16a in the z-axis direction and connect the external electrodes 12a to 12d to the internal conductors 18a to 18d, respectively.

As shown in FIG. 2, the via-hole conductor b5 extends through the insulating material layer 16g and connects the coils L1 and L2 or the capacitor C (not shown in FIG. 2) to the internal conductor 20. It should be noted that only the via-hole conductors b1 to b5 are shown in FIG. 2 but, in reality, other via-hole conductors are provided. It should be noted that it is preferable that the via-hole conductors are not connected to the internal conductor 20 in each of the regions A1 to A6.

The insulating material layers 16a to 16h are laminated to obtain the circuit board 10 shown in FIG. 1.

Figure 5:
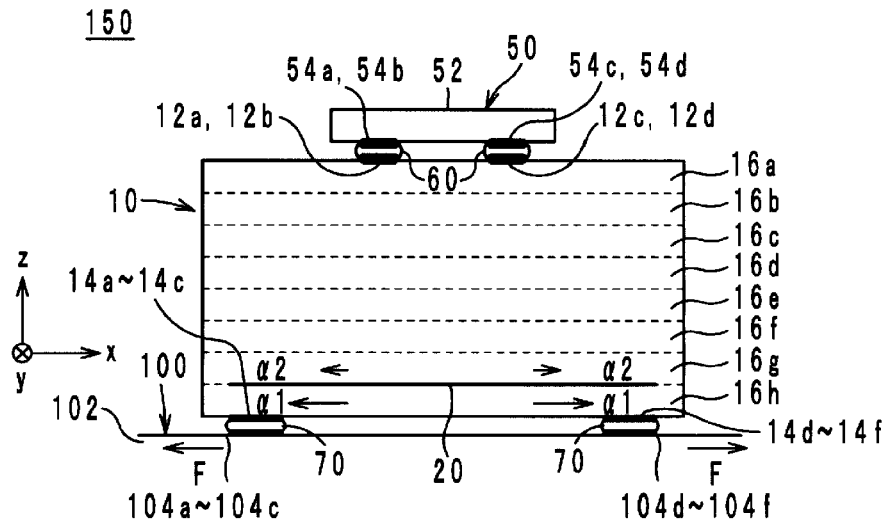
FIG. 5 is a configuration diagram of a module that includes the circuit board.

FIG. 5 is a configuration diagram of a module 150 that includes the circuit board 10. The module 150 preferably includes the circuit board 10, an electronic component 50, and a printed wiring board 100.

As shown in FIG. 5, the electronic component 50 is an element mounted on the circuit board 10, such as a semiconductor integrated circuit, for example. The electronic component 50 preferably includes a main body 52 and external electrodes 54 (54a to 54d). The main body 52 is preferably, for example, a hard board made of a semiconductor substrate. The external electrodes 54 are provided on a principal surface (lower surface) of the main body 52 on the negative direction side in the z-axis direction. The external electrodes 54a to 54d are connected to the external electrodes 12a to 12d, respectively, via solder 60. Thus, the electronic component 50 is mounted on the upper surface of the circuit board 10.

The printed wiring board 100 preferably includes a main body 102 and external electrodes 104 (104a to 104f). The main body 102 is preferably, for example, a hard board made of a resin or other suitable. The external electrodes 104 are provided on a principal surface (upper surface) of the main body 102 on the positive direction side in the z-axis direction. The external electrodes 104a to 104f are connected to the external electrodes 14a to 14f, respectively, preferably via a joining material, such as solder 70, for example. Thus, the circuit board 10 is mounted at the lower surface thereof on the printed wiring board 100. The module 150 described above is preferably mounted in an electronic device, such as a cellular phone, for example.

Hereinafter, a method for manufacturing the circuit board 10 according to a preferred embodiment of the present invention will be described with reference to the drawings. First, the insulating material layer 16*a* having copper foil formed on all or substantially all of both principal surfaces thereof is prepared, and the insulating material layers 16*b* to 16*h* including copper foil formed on all or substantially all of one principal surface thereof are prepared. In the insulating material layers 16*b* to 16*h*, the principal surface on which the copper foil is formed is referred to as back surface.

Next, a laser beam is applied from the front surface side or the back surface side to locations (see FIG. 2) in the insulating material layer 16*a* at which the via-hole conductors b1 to b4 are to be formed, to form via holes. In addition, a laser beam is applied from the front surface side to a position (see FIG. 2) in the insulating material layer 16*g* at which the via-hole conductor b5 is to be formed, to form a via hole. Further, via holes are formed in the insulating material layers 16*b* to 16*f* and 16*h* as necessary.

Next, the external electrodes 12 shown in FIG. 2 are preferably formed on the front surface of the insulating material layer 16*a* by a photolithographic process, for example. Specifically, resists having the same or substantially the same shapes as those of the external electrodes 12 shown in FIG. 2 are printed on the copper foil of the insulating material layer 16*a*. Then, etching treatment is performed on the copper foil to remove the portion of the copper foil that is not covered with the resists. Then, the resists are removed. By so doing, the external electrodes 12 shown in FIG. 2 are formed on the front surface of the insulating material layer 16*a*.

Moreover, the internal conductors 18 shown in FIG. 2 are preferably formed on the back surface of the insulating material layer 16*a* by a photolithographic process, for example. It should be noted that this photolithographic process is substantially the same as the photolithographic process performed when forming the external electrodes 12, and thus the description thereof is omitted.

Next, the internal conductor 20 shown in FIG. 2 is preferably formed on the back surface of the insulating material layer 16*g* by a photolithographic process, for example. In addition, the internal conductors (not shown in FIG. 2) that are to define the coils L1 and L2 and the capacitor C in FIG. 3 are preferably formed on the back surfaces of the insulating material layers 16*b* to 16*f*. Further, the external electrodes 14 shown in FIG. 2 are preferably formed on the back surface of the insulating material layer 16*h* by a photolithographic process, for example. It should be noted that these photolithographic processes are substantially the same as the photolithographic process performed when forming the external electrodes 12, and thus the description thereof is omitted.

Next, the via holes formed in the insulating material layers 16*a* and 16*g* are filled with a conductive paste preferably including copper as a principal component, for example, to form the via-hole conductors b1 to b5 shown in FIG. 2. In addition, when via holes are formed in the insulating material layers 16*b* to 16*f* and 16*h*, the via holes are filled with the conductive paste.

Next, the insulating material layers 16*a* to 16*h* are stacked in that order. In this case, as shown in FIG. 3, the insulating material layers 16*a* to 16*h* are laminated such that the internal conductor 20 extends across the regions A1 to A6 (see FIG. 1) obtained by connecting the external electrodes 14 to the external electrodes 12 located closest to the external electrodes 14. Then, forces are applied to the insulating material layers 16*a* to 16*h* from the upper and lower directions in the lamination direction, to pressure-bond the insulating material layers 16*a* to 16*h*. By so doing, the circuit board 10 shown in FIG. 1 is obtained.

Figure 11:
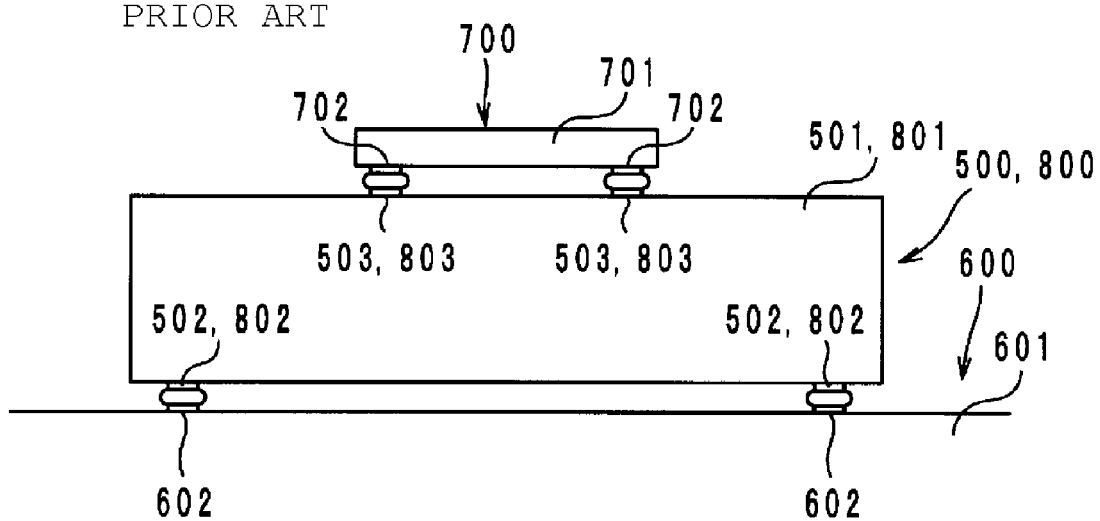
FIG. 11 is a diagram illustrating a known circuit board mounted on a printed wiring board.

In the circuit board 10, as described below, even when the printed wiring board 100 deforms, detachment or separation of the circuit board 10 from the printed wiring board 100 is prevented. Specifically, due to an impact generated when an electronic device in which the existing circuit board 500 and the printed wiring board 600 shown in FIG. 11 are mounted is dropped, the printed wiring board 600 may be bent. Even when the printed wiring board 600 is bent, the circuit board 500 cannot significantly deform so as to follow the bending of the printed wiring board 600, since the circuit board 500 is a hard board. Thus, a load is applied to the solder that connects the external electrodes 502 to the external electrodes 602. As a result, the solder may break and the circuit board 500 may detach or separate from the printed wiring board 600.

For that reason, in the circuit board 10, the laminate 11 is preferably defined by the laminated insulating material layers 16 made of a flexible material. Therefore, the circuit board 10 can be more easily bent as compared to the circuit board 500. Thus, even when the printed wiring board 100 is bent due to dropping of the electronic device in which the module 150 shown in FIG. 5 is mounted, the circuit board 10 can deform so as to follow the bending of the printed wiring board 100. As a result, the application of a load to the solder that connects the external electrodes 14 to the external electrodes 104 is prevented, and detachment or separation of the circuit board 10 from the printed wiring board 100 is prevented.

Moreover, in the circuit board 10, as described below, detachment or separation of the electronic component 50 from the circuit board 10 is prevented. Specifically, the printed circuit board 800 shown in FIG. 11 and described in Japanese Unexamined Patent Application Publication No. 2006-93438 has flexibility across the entire surface thereof. Thus, the printed circuit board 800 is bent across the entire surface thereof. On the other hand, the electronic component 700 is made of a semiconductor substrate, and thus, cannot significantly bend. Thus, a load is applied to the external electrodes 702 and 803 and the solder that connects the external electrodes 702 and 803. As a result, the solder breaks or the external electrodes 702 and 803 are separated from the main bodies 701 and 801. In other words, the connection between the electronic component 700 and the printed circuit board 800 is broken.

For that reason, in the circuit board 10, the internal conductor 20 preferably extends across the regions A1 to A6 obtained by connecting the external electrodes 14 to the external electrodes 12 located closest to the external electrodes 14. In addition, the internal conductor 20 is fixed to the insulating material layer 16*g* but is not fixed to the insulating material layer 16*h*. Thus, as described below, detachment or separation of the electronic component 50 from the circuit board 10 is prevented. Specifically, when the printed wiring board 100 is convexly bent, the external electrodes 104 are displaced in the directions of arrows F as shown in FIG. 5. The external electrodes 104 are connected to the external electrodes 14 via the solder 70. In addition, the laminate 11 preferably has flexibility. Thus, the external electrodes 14 receive stress in the directions of the arrows F as the external electrodes 104 are displaced. As a result, in the insulating material layer 16*h*, tensile stress α1 occurs in the x-axis direction. The stress α1 tends to be transmitted toward the positive direction side in the z-axis direction.

Here, the internal conductor 20 is preferably made, for example, of metal foil of copper or other suitable material, and the insulating material layer 16*h* is preferably made of a thermoplastic resin, such as a liquid crystal polymer, for example. Since the insulating material layer 16*h* and the internal conductor 20 are merely press-bonded to each other, there are no chemical bonds and other bonds between the front surface of the insulating material layer 16h and the internal conductor 20, and the front surface of the insulating material layer 16h and the internal conductor 20 are preferably not fixed to each other. Thus, the front surface of the insulating material layer 16 and the internal conductor 20 can slide relative to each other. Therefore, when tensile stress occurs in the insulating material layer 16h, slippage occurs between the front surface of the insulating material layer 16h and the internal conductor 20.

As described above, when slippage occurs between the front surface of the insulating material layer 16h and the internal conductor 20, stress is not efficiently transmitted from the insulating material layer 16h to the insulating material layer 16g. Due to this, tensile stress $\alpha 2$ occurring in the insulating material layer 16g is less than the tensile stress $\alpha 1$ occurring in the insulating material layer 16h. Therefore, elongation occurring in the insulating material layers 16a to 16h decreases from the negative direction side toward the positive direction side in the z-axis direction. Thus, the external electrodes 12a and 12b provided on the front surface of the insulating material layer 16a are not significantly displaced. As a result, in the circuit board 10, detachment or separation of the electronic component 50 from the circuit board 10 is effectively prevented.

Particularly, stress from the external electrode 14 is most efficiently transmitted to the external electrode 12 located closest to the external electrode 14 among a plurality of the external electrodes 12. In other words, stress from the external electrodes 14a to 14f is transmitted through the regions A1 to A6 to the external electrodes 12a to 12d. For that reason, in the circuit board 10, the internal conductor 20 extends across the regions A1 to A6. Due to this, transmission of stress from the external electrode 14 to the external electrode 12 located closest to the external electrode 14 is prevented. As a result, in the circuit board 10, detachment or separation of the electronic component 50 from the circuit board 10 is effectively prevented.

Further, as shown in FIGS. 2 and 3, the internal conductor 20 is in contact with the insulating material layer 16h defining the lower surface of the laminate 11. In other words, the internal conductor 20 is provided in the laminate 11 at the interface between the insulating material layers 16 located closest to the lower surface of the laminate 11. Thus, the stress $\alpha 1$ shown in FIG. 5 is unlikely to be transmitted to the insulating material layers 16a to 16g located on the positive direction side in the z-axis direction with respect to the internal conductor 20. Due to this, deformation of the insulating material layers 16a to 16g is prevented, and deformation of the coils L1 and L2 and the capacitor C is prevented. As a result, changes in the characteristics of the coils L1 and L2 and the capacitor C are prevented.

In the circuit board 10, as shown in FIG. 3, in addition to the internal conductor 20, portions of the internal conductors 18 and portions of the internal conductors defining the coils L1 and L2 and the capacitor C also extend across the regions A1 to A6. Thus, the portions of the internal conductors 18 and the portions of the internal conductors defining the coils L1 and L2 and the capacitor C also contribute to preventing detachment or separation of the electronic component 50 from the circuit board 10.

Further, the internal conductors 16 have been described as an example of a slippage occurrence layer that can cause slippage relative to the insulating material layer 16, but the slippage occurrence layer is not limited to the internal conductors 18 and may be various inorganic material layers or organic material layers that are not fused to the insulating material layers 16 when the insulating material layers 16 are laminated/press-bonded. Alternatively, a material that disappears during lamination/press-bonding to provide a gap between the insulating material layers may be used.

Figure 6:
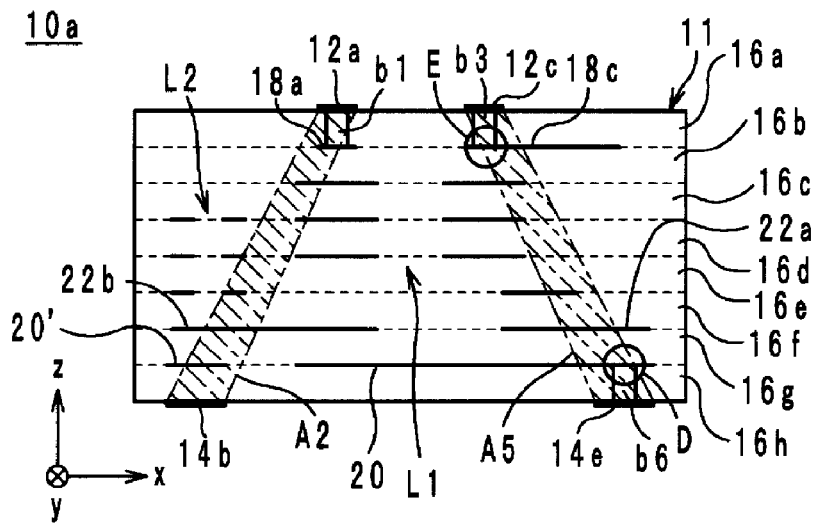
FIG. 6 is a cross-sectional structural view of a circuit board according to a first modified example of a preferred embodiment of the present invention.
Figure 7:
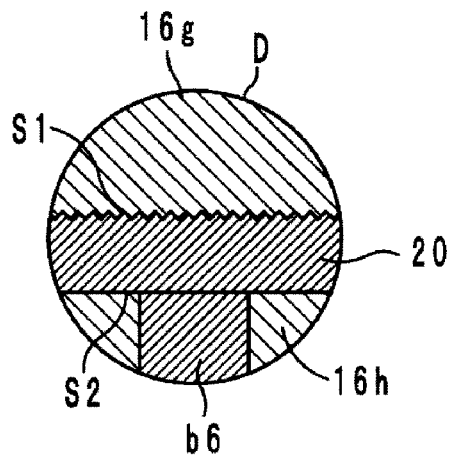
FIG. 7 is an enlarged view at D in FIG. 6.
Figure 8:
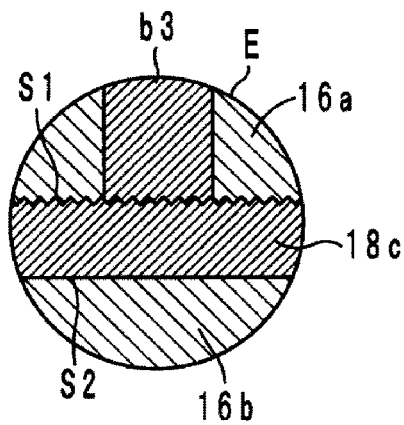
FIG. 8 is an enlarged view at E in FIG. 6.

Hereinafter, a circuit board 10a according to a first modified example of a preferred embodiment of the present invention will be described with reference to the drawings. FIG. 6 is a cross-sectional structural view of the circuit board 10a according to the first modified example. FIG. 7 is an enlarged view at D in FIG. 6. FIG. 8 is an enlarged view at E in FIG. 6.

In the circuit board 10a, as shown in FIG. 6, the internal conductor 20 is preferably connected to the external electrode 14e via a via-hole conductor b6 extending through the insulating material layer 16h. In this case, as shown in FIG. 7, the via-hole conductor b6 is connected to the principal surface S2 of the internal conductor 20. The via-hole conductor b6 and the internal conductor 20 are preferably made of the same metal (e.g., copper), and are metal-bonded to each other during press-bonding. Thus, when the via-hole conductor b6 is connected to the principal surface S2 of the internal conductor 20, the occurrence of slippage between the internal conductor 20 and the front surface of the insulating material layer 16h is prevented. As a result, stress $\alpha 1$ from the external electrode 14e is transmitted toward the positive direction side in the z-axis direction with respect to the internal conductor 20.

Further, in the circuit board 10a, an internal conductor 20' preferably does not extend across the region A2. Thus, a sufficient slippage does not occur between the internal conductor 20' and the front surface of the insulating material layer 16h. As a result, stress $\alpha 1$ from the external electrode 14b is transmitted toward the positive direction side in the z-axis direction with respect to the internal conductor 20'.

For that reason, in the circuit board 10a, internal conductors 22a and 22b are provided between the insulating material layers 16f and 16g so as to extend across the regions A2 and A5. Due to this, transmission of the stress $\alpha 1$ toward the positive direction side in the z-axis direction with respect to the internal conductors 22a and 22b is prevented. As a result, in the circuit board 10a, detachment or separation of the electronic component 50 from the circuit board 10a is prevented.

As shown in FIG. 6, the via-hole conductor b3 is preferably connected to the internal conductor 18c. Thus, slippage is unlikely to occur between the internal conductor 18c and the front surface of the insulating material layer 16b. However, as shown in FIG. 8, the via-hole conductor b3 is connected to the principal surface S1 of the internal conductor 18c and also extends through the insulating material layer 16a. The internal conductor 18c is fixed to the insulating material layer 16a. Thus, slippage may occur between the internal conductor 18c and the front surface of the insulating material layer 16b. Therefore, the internal conductor 18c also contributes to the prevention of detachment or separation of the electronic component 50 from the circuit board 10a.

Next, internal conductors according to modified examples of preferred embodiments of the present invention will be described with reference to the drawings. FIGS. 9A, 9B and 10A-10C are diagrams illustrating internal conductors 20a to 20e according to the modified examples.

Figure 9A:
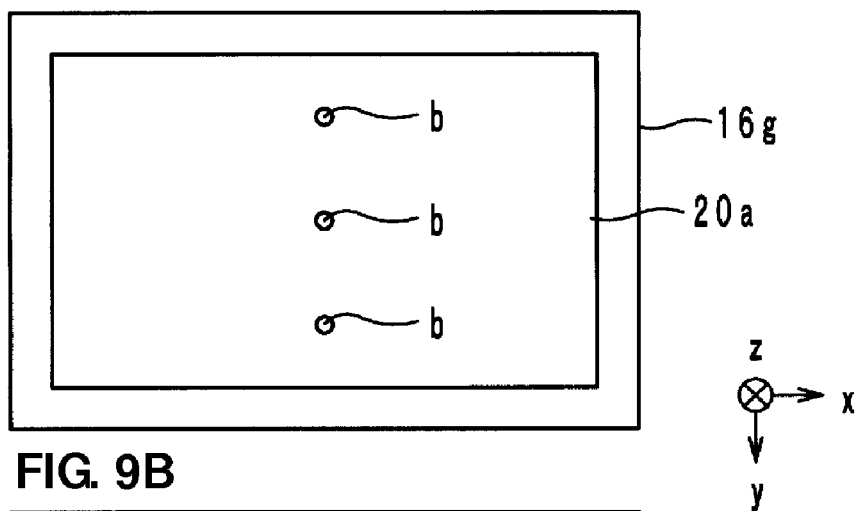
FIGS. 9A and 9B are diagrams illustrating internal conductors according to a modified example of a preferred embodiment of the present invention.

As shown in FIG. 9A, a plurality of via-hole conductors b extending through the insulating material layer 16g are preferably connected to the internal conductor 20a. In this case, the plurality of via-hole conductors b are preferably aligned in the y-axis direction. The x-axis direction corresponds to the longitudinal direction of the internal conductor 20a. For that reason, the internal conductor 20a more easily expands and contracts in the x-axis direction than in the y-axis direction.

Thus, the plurality of via-hole conductors b are preferably aligned in the y-axis direction in which the via-hole conductors b are less likely to be influenced by expansion and contraction of the internal conductor 20a.

Figure 9B:
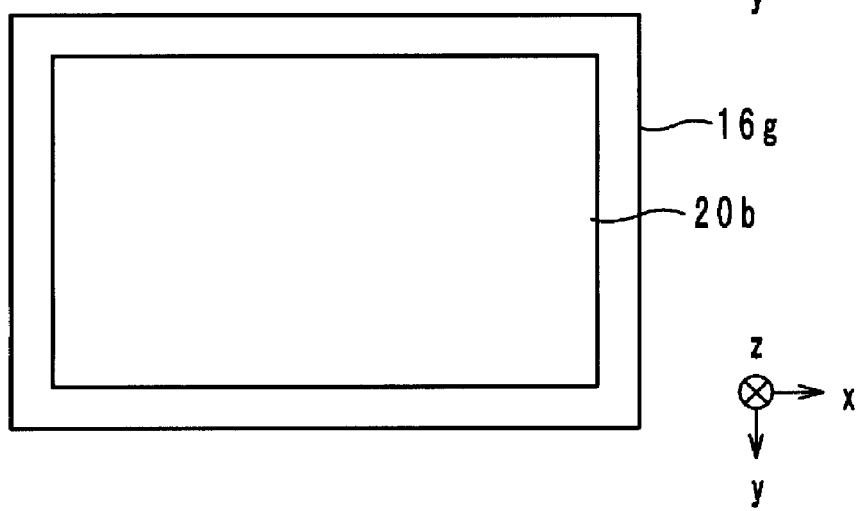

It should be noted that as in the internal conductor 20b shown in FIG. 9B, no via-hole conductors b may be provided. In this case, the internal conductor 20b defines a dummy conductor.

Figure 10A:
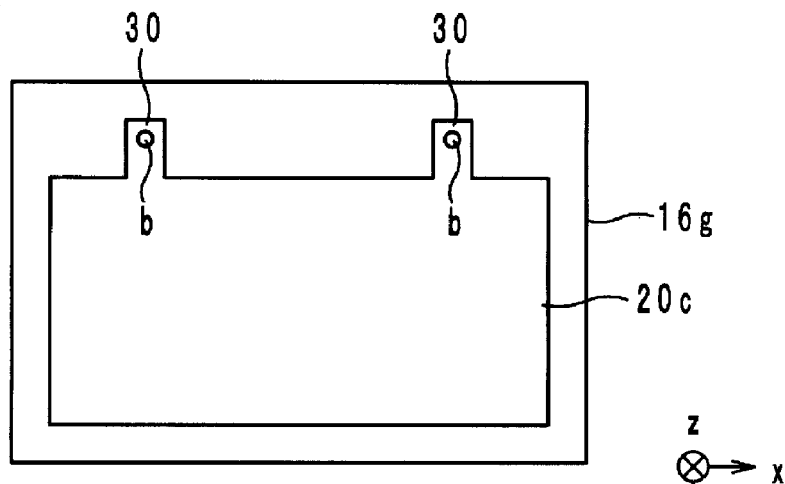
FIGS. 10A-10C are diagrams illustrating internal conductors according to a modified example of a preferred embodiment of the present invention.
Figure 10B:
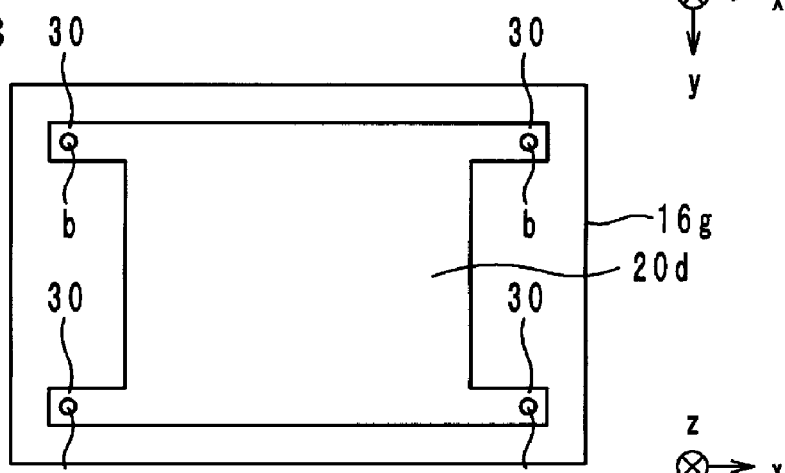
Figure 10C:
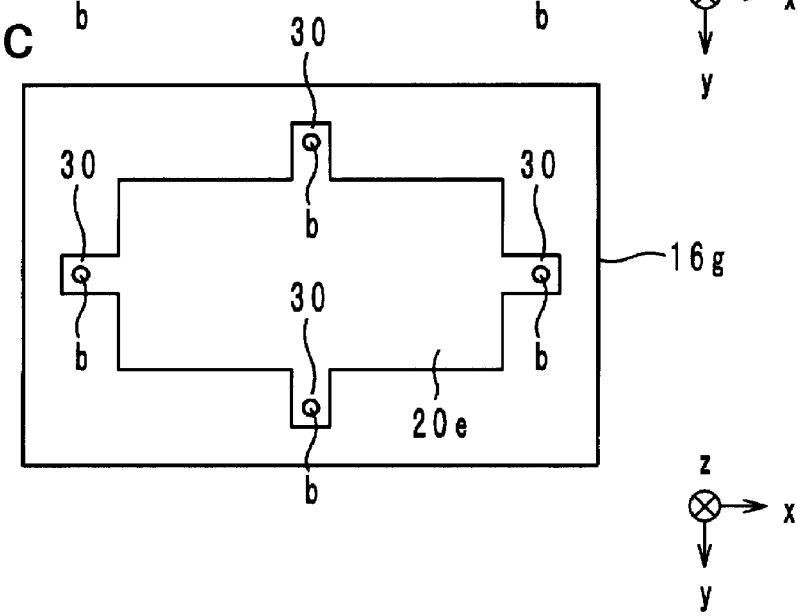

Further, as shown in FIGS. 10A-10C, when via-hole conductors b are connected to branch portions 30 provided to the internal conductors 20c to 20e as shown in the internal conductors 20c to 20e, the via-hole conductors b may preferably be aligned in the x-axis direction.

In FIGS. 9A, 9B, and 10A-10C, the via-hole conductors b are preferably provided in the insulating material layer 16g. However, for example, even when the via-hole conductors b are provided in the insulating material layer 16h, the via-hole conductors b are preferably arranged as shown in FIGS. 9A, 9B, and 10.

In the circuit board 10, the internal conductor 20 preferably extends across all the regions A1 to A6. However, the internal conductor 20 does not necessarily have to extend across all of the regions A1 to A6, and suffices to extend across at least one of the regions A1 to A6. It should be noted that the internal conductor 20 preferably extends across the regions A1, A3, A4, and A6 obtained by connecting the external electrodes 14a, 14c, 14d, and 14f located closest to the four corners of the lower surface of the laminate 11 to the external electrodes 12a, 12b, 12c, and 12d located closest to the external electrodes 14a, 14c, 14d, and 14f. This is because the external electrodes 14a, 14c, 14d, and 14f located near the corners of the lower surface are easily displaced as compared to the external electrodes 14b and 14e.

The internal conductor 20 may preferably be provided on the front surface of the insulating material layer 16h, and not on the back surface of the insulating material layer 16g.

Further, in order to make the surface roughness Ra of the front surface of the principal surface S1 greater than the surface roughness Ra of the back surface of the principal surface S2, for example, the principal surface S2 may be coated with fluorine.

The internal conductor may preferably be a wiring conductor, other than a ground conductor, a capacitor conductor, and a dummy conductor, for example.

Further, the slippage occurrence layer is preferably provided in the region A extending over a plurality of layers, not over a single layer.

Preferred embodiments of the present invention are useful for circuit boards, and are particularly useful and advantageous in being able to prevent detachment or separation of an electronic component from a circuit board.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A circuit board comprising:
    a laminate including a plurality of laminated insulating material layers made of a flexible material;
    a plurality of first external electrodes provided on an upper surface of the laminate and arranged to be connected to an electronic component;
    a second external electrode provided on a lower surface of the laminate and arranged to be connected to a wiring board; and
    a slippage occurrence layer provided between adjacent insulating material layers of the plurality of insulating layers and extending across a region obtained by connecting the second external electrode to the first external electrode located closest to the second external electrode; wherein
    the slippage occurrence layer is not fixed to at least one of the plurality of insulating material layers.

2. The circuit board according to claim 1, wherein the slippage occurrence layer is an internal conductor that is not fixed to one of the plurality of insulating material layers and is fixed to another one of the plurality of insulating material layers.

3. The circuit board according to claim 2, wherein a surface roughness of a principal surface of the internal conductor that is in contact with the one of the plurality of insulating material layers is greater than a surface roughness of a principal surface of the internal conductor that is in contact with the another one of the plurality of insulating material layers.

4. The circuit board according to claim 2, wherein the internal conductor is located on an insulating material layer of the plurality of insulating material layers defining the lower surface of the laminate.

5. The circuit board according to claim 2, wherein the internal conductor is any one of a ground conductor, a capacitor conductor, a coil conductor, a wiring conductor, or a dummy conductor.

6. The circuit board according to claim 2, further comprising a via-hole conductor arranged so as to extend through the one of the insulating material layers and connected to the internal conductor.

7. The circuit board according to claim 6, wherein the via-hole conductor is not provided in a region obtained by connecting the first external electrodes to the second external electrode.

8. The circuit board according to claim 1, wherein
    the lower surface is rectangular or substantially rectangular;
    a plurality of the second external electrodes are arranged so as to be aligned along two parallel sides of the lower surface; and
    the slippage occurrence layer extends across regions obtained by connecting the second external electrodes located closest to four corners of the lower surface to the first external electrodes located closest to the second external electrodes.

9. A method for manufacturing a circuit board according to claim 1, the method comprising:
    a step of forming the first external electrodes, the second external electrode, and the slippage occurrence layer on the plurality of insulating material layers; and
    a step of laminating the plurality of insulating material layers such that the slippage occurrence layer extends across a region obtained by connecting the second external electrode to the first external electrode located closest to the second external electrode.

* * * * *